(12) United States Patent
Kim et al.

(10) Patent No.: US 11,702,571 B2
(45) Date of Patent: Jul. 18, 2023

(54) ADHESIVE SHEET FOR TEMPORARY FIXATION AND METHOD OF MANUFACTURING SEMICONDUCTOR DEVICE USING THE SAME

(71) Applicant: LG CHEM, LTD., Seoul (KR)

(72) Inventors: Sera Kim, Daejeon (KR); Ji Ho Han, Daejeon (KR); Kwang Joo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 531 days.

(21) Appl. No.: 16/762,863

(22) PCT Filed: Mar. 28, 2019

(86) PCT No.: PCT/KR2019/003668
§ 371 (c)(1),
(2) Date: May 8, 2020

(87) PCT Pub. No.: WO2019/190242
PCT Pub. Date: Oct. 3, 2019

(65) Prior Publication Data
US 2021/0171802 A1 Jun. 10, 2021

(30) Foreign Application Priority Data

Mar. 28, 2018 (KR) .................. 10-2018-0035996
Mar. 26, 2019 (KR) .................. 10-2019-0034621

(51) Int. Cl.
*C09J 7/22* (2018.01)
*C09J 7/40* (2018.01)
(Continued)

(52) U.S. Cl.
CPC .................. *C09J 7/22* (2018.01); *C09J 7/385* (2018.01); *C09J 7/40* (2018.01); *C09J 133/08* (2013.01);
(Continued)

(58) Field of Classification Search
None
See application file for complete search history.

(56) References Cited

U.S. PATENT DOCUMENTS 8,592,521 B2 11/2013 Higuchi
2008/0280149 A1 11/2008 Higuchi et al.
(Continued)

FOREIGN PATENT DOCUMENTS

CN 102971839 A 3/2013
CN 103715124 A 4/2014
(Continued)

OTHER PUBLICATIONS

Machine translation of WO 2017138544 A1 (Year: 2017).*
(Continued)

*Primary Examiner* — Frank D Ducheneaux
(74) *Attorney, Agent, or Firm* — Rothwell, Figg, Ernst & Manbeck, P.C.

(57) ABSTRACT

An adhesive sheet for temporary fixation which may have excellent heat resistance to exhibit a sufficient adhesive force even though it undergoes a high temperature process during a process of manufacturing a semiconductor device and may also exhibit a sufficient reduction of the adhesive force by photocuring during the step of peeling off, and a method of manufacturing a semiconductor device using the same, are provided.

12 Claims, 2 Drawing Sheets

(51) Int. Cl.
*C09J 133/08* (2006.01)
*C09J 133/24* (2006.01)
*C09J 7/38* (2018.01)
*C09J 167/02* (2006.01)
*H01L 21/683* (2006.01)

(52) U.S. Cl.
CPC ........... *C09J 133/24* (2013.01); *C09J 167/02* (2013.01); *H01L 21/6836* (2013.01); *C09J 2203/326* (2013.01); *C09J 2301/124* (2020.08); *C09J 2301/208* (2020.08); *C09J 2301/312* (2020.08); *C09J 2301/416* (2020.08); *C09J 2433/00* (2013.01); *H01L 2221/68386* (2013.01)

(56) References Cited

U.S. PATENT DOCUMENTS

| | | |
|---|---|---|
| 2011/0104874 A1 | 5/2011 | Maeda et al. |
| 2011/0278049 A1 | 11/2011 | Kim et al. |
| 2012/0070780 A1 | 3/2012 | Choi et al. |
| 2012/0302041 A1 | 11/2012 | Maeda et al. |
| 2013/0092318 A1 | 4/2013 | Saito et al. |
| 2016/0333225 A1 | 11/2016 | Enoki et al. |

FOREIGN PATENT DOCUMENTS

| | | |
|---|---|---|
| CN | 110240869 A | 9/2019 |
| JP | 2006-156754 A | 6/2006 |
| JP | 2008-231268 A | 10/2008 |
| JP | 2009-242733 A | 10/2009 |
| JP | 2013-209519 A | 10/2013 |
| JP | 2013-231159 A | 11/2013 |
| JP | 5369556 B2 | 12/2013 |
| JP | 2015-005598 A | 1/2015 |
| JP | 2016-069474 A | 5/2016 |
| JP | 2017-155213 A | 9/2017 |
| KR | 10-1996-0017694 A | 6/1996 |
| KR | 10-2008-0099160 A | 11/2008 |
| KR | 10-2011-0041389 A | 4/2011 |
| KR | 10-2012-0060938 A | 6/2012 |
| KR | 10-2012-0062667 A | 6/2012 |
| KR | 10-2013-0066273 A | 6/2013 |
| KR | 10-2016-0111385 A | 9/2016 |
| KR | 10-2017-0003429 A | 1/2017 |
| KR | 10-2017-0092928 A | 8/2017 |
| KR | 10-1767106 B1 | 8/2017 |
| TW | 201126617 A | 8/2011 |
| TW | 201430083 A | 8/2014 |
| WO | 2013-146062 A1 | 10/2013 |
| WO | 2017-138544 A1 | 8/2017 |

OTHER PUBLICATIONS

Masaki Ohwa, "Recent Aspects in Photoinitiators" Journal of Printing Science and Technology, 2003, p. 168-175.
International Search Report Issue for International Application No. PCT/KR2019/003668 dated Jul. 11, 2019, 9 pages.

* cited by examiner

[FIG. 1]
(a)
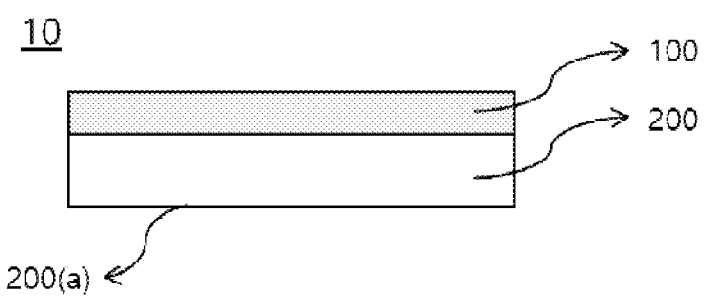
(b)
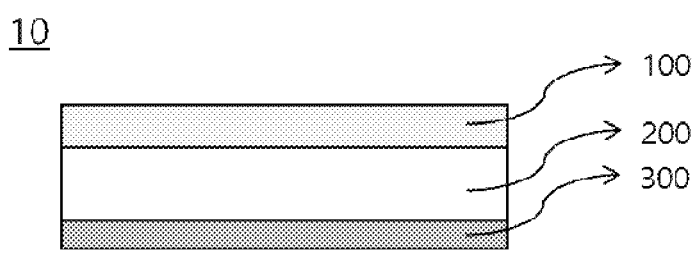

[FIG. 2]
(a)
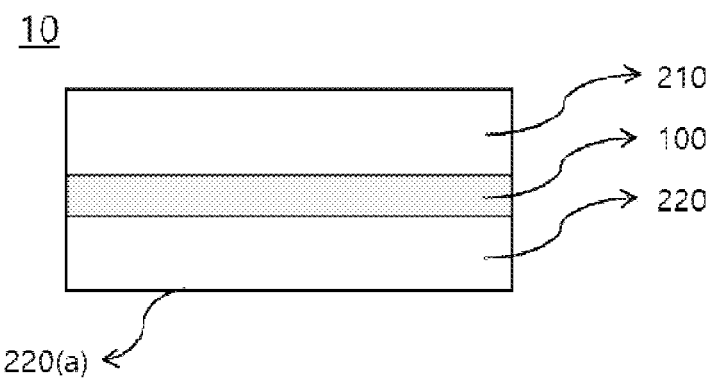
(b)
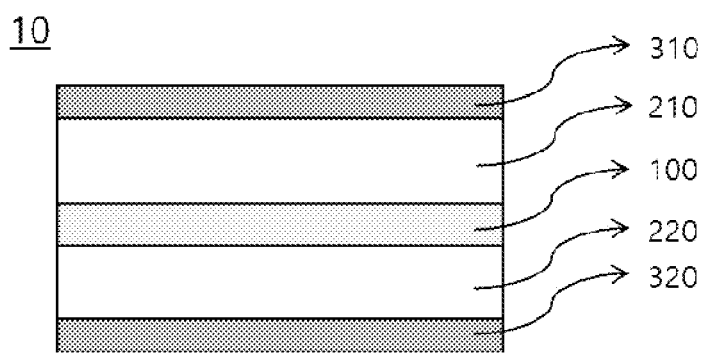

ADHESIVE SHEET FOR TEMPORARY FIXATION AND METHOD OF MANUFACTURING SEMICONDUCTOR DEVICE USING THE SAME

CROSS-REFERENCE TO RELATED APPLICATIONS

This application is a 35 U.S.C. 371 National Phase Entry Application from PCT/KR2019/003668, filed on Mar. 28, 2019, designating the United States and which claims priority from, Korean Patent Application Nos. 10-2018-0035996 and 10-2019-0034621, filed on Mar. 28, 2018 and Mar. 26, 2019, respectively, the disclosures of which are hereby incorporated by reference herein in their entirety.

TECHNICAL FIELD

The present invention relates to an adhesive sheet for temporary fixation, and a method of manufacturing a semiconductor device using the same.

BACKGROUND OF THE INVENTION

In recent years, there has been a predominant trend toward smaller, thinner, and higher-capacity electronic devices, and therefore, a demand for high density and high integration of semiconductor packages is becoming stronger. To meet this demand, the size of a semiconductor chip is gradually increasing, and at the same time, the thickness of the chip is becoming thinner.

The thin semiconductor chip has a problem in that there is a difficulty in handling during a manufacturing process. For this reason, a method of temporarily fixing the thin semiconductor chip by using an adhesive sheet or the like and then performing processing, treating, and transporting of the semiconductor chip in the temporary fixation state has been applied.

However, since many semiconductor manufacturing processes are performed under high temperature conditions, high heat resistance of the adhesive sheet is required to prevent the problem of deterioration of adhesive force during the process. Further, in a process of detaching the fixed thin semiconductor chip after completing a series of processes, sufficient peelability is also required so as to leave no residues on the surface without damaging the semiconductor chip.

Recently, an ultraviolet curable adhesive of which adhesive force is reduced by ultraviolet irradiation has been used as a temporary adhesive material. However, the existing adhesives have problems in that additives such as photoinitiators in the adhesive are thermally decomposed during a high temperature process, or reduction of the adhesive force is not sufficient during the step of peeling off due to migration of the additives.

Accordingly, it is necessary to develop an adhesive sheet that satisfies high levels of adhesive force, heat resistance, and peelability for use in temporary fixation.

BRIEF DESCRIPTION OF THE INVENTION

The present invention provides an adhesive sheet for temporary fixation which may have excellent heat resistance to exhibit a sufficient adhesive force even though it undergoes a high temperature process during a process of manufacturing a semiconductor device, and may also exhibit sufficient reduction of the adhesive force by photocuring during the step of peeling off.

Further, the present invention provides a method of manufacturing a semiconductor device using the adhesive sheet for temporary fixation.

According to the present invention, an adhesive sheet for temporary fixation is provided, the adhesive sheet including: a polymer base film having a glass transition temperature (Tg) of 60° C. or more; and at least one adhesive layer including a binder resin having a photoreactive functional group, a photoinitiator having activity at a wavelength of 300 nm or more, and a tertiary amine compound, wherein a ratio of an adhesive force (A2) measured after light-irradiating the heat-treated adhesive layer to an initial adhesive force (A1) measured after heat-treating the adhesive layer at a temperature of 150° C. to 200° C. is 50% or less.

Further, according to the present invention, a method of manufacturing a semiconductor device is provided, the method including: attaching the adhesive layer of the adhesive sheet for temporary fixation onto a predetermined portion of the semiconductor device; performing a predetermined process of the semiconductor device on which the adhesive sheet is attached; irradiating UV rays onto the base film of the adhesive sheet for temporary fixation after performing the predetermined process; and detaching the adhesive sheet for temporary fixation from the semiconductor device.

DETAILED DESCRIPTION OF THE INVENTION

Hereinafter, an adhesive sheet for temporary fixation and a method of manufacturing a semiconductor device using the same according to embodiments of the present invention will be described in detail.

Unless the context clearly indicates otherwise, technical terminology used herein is for the purpose of describing particular embodiments only, and is not intended to be limiting of the invention.

Singular forms used herein may include plural forms unless the context clearly indicates otherwise.

The term 'including', when used in this specification, specifies the presence of stated features, regions, integers, steps, operations, elements, and/or components, but does not preclude the presence or addition of other features, regions, integers, steps, operations, elements, components, and/or groups.

Terms including ordinal numbers such as 'first' and 'second' are merely employed to differentiate a certain component from other components, and the elements are not limited by the ordinal numbers. For example, within the scope of the present invention, a first component may also be referred to as a second component, and similarly, a second component may be referred to as a first component.

As a result of continuous research by the present inventors, it was found that, with regard to an adhesive sheet for temporary fixation which is used in a process of manufacturing a semiconductor device, when a base film is formed using a UV-transmittable heat-resistant polymer and an adhesive layer is formed using a particular component, of which photopolymerization may be initiated at the transmission wavelength region of the base film, an excellent adhesive force may be achieved during the process of manufacturing the semiconductor device and the adhesive force may be sufficiently reduced by photocuring during the step of peeling off even though a high temperature process is performed. Accordingly, it was confirmed that the manufacturing efficiency of the semiconductor device may be improved and the manufactured semiconductor device may exhibit excellent quality.

I. Adhesive Sheet for Temporary Fixation

According to one embodiment of the present invention, an adhesive sheet for temporary fixation is provided, the adhesive sheet including a base film and an adhesive layer, wherein a ratio of an adhesive force (A2) measured after light-irradiating the heat-treated adhesive layer to an initial adhesive force (A1) measured after heat-treating the adhesive layer at a temperature of 150° C. to 200° C. is 50% or less.

Preferably, the ratio (R) of the adhesive force (A2') measured after light-irradiating the heat-treated adhesive layer to the initial adhesive force (A1') measured after heat-treating the adhesive layer at a temperature of 150° C. to 200° may be defined by the following General Formula 1:

$$R(\%)=A2'*100/A1' \quad \text{[General Formula 1]}$$

wherein, in General Formula 1, A1' represents the adhesive force of the adhesive layer after heat treatment at 180° C. for 2 hours, and A2' represents the adhesive force of the adhesive layer measured after irradiating the heat-treated adhesive layer with UV rays at a mixed wavelength of 200 nm to 500 nm at a light dose of 100 mJ/cm$^2$ to 1000 mJ/cm$^2$.

The adhesive force ratio (R) of the adhesive layer is an index indicating whether the adhesive layer exhibits an excellent adhesive force even under high temperature conditions during a process of manufacturing a semiconductor device and a sufficient reduction of the adhesive force by photocuring in the step of peeling off. Since the adhesive sheet for temporary fixation according to the present invention satisfies the adhesive force ratio (R) of 50% or less, it is applied to a process of manufacturing a semiconductor device, thereby remarkably improving process efficiency and manufacturing a high-quality semiconductor device. The adhesive force ratio (R) may be obtained by controlling the material of the adhesive layer, the process conditions of the adhesive layer, etc.

In the present invention, when the adhesive force ratio (R) is more than 50%, it is difficult to obtain sufficient peelability effect by photocuring. In this case, there are problems that adhesive residues may exist on the surface of the object semiconductor or the semiconductor may be damaged. The adhesive force ratio may be preferably 40% or less, and more preferably 30% or less, 20% or less, or 10% or less.

Base Film

The base film according to embodiments of the present invention may be a polymer base film having a glass transition temperature of 60° C. or more. When the base film satisfies the glass transition temperature of 60° C. or more, sufficient heat resistance may be obtained, and accordingly, wrinkling and deformation problems may not occur during the high temperature process, thereby easily performing the process of manufacturing the semiconductor.

In the present invention, when the glass transition temperature of the base film is less than 60° C., deterioration and deformation problems may occur under high temperature conditions during the process of manufacturing the semiconductor, which adversely affects the process. As a result, defects may occur during the semiconductor process. The glass transition temperature of the base film may preferably be 70° C. or more, or 90° C. or more. In this case, the above-described effects may be further improved.

In the present invention, the polymer base film may include, for example, one or more polymer compounds selected from the group consisting of polyimide, polyamideimide, polyetherether ketone, polyethylene terephthalate, polyethylene naphthalate, polyphenylene sulfide, and polyamide. Preferably, the polymer base film may include polyethylene terephthalate, polyethylene naphthalate, and polyamideimide.

In the present invention, when the base film includes a mixture of two or more of the polymers, it may include a film of a laminate structure in which two or more of individual films including the above-described polymers are laminated, or a film of a single layer including two or more of the above-described polymers.

Further, the base film may include the above-described heat resistant polymer component, and at the same time, may satisfy transmittance of 50% or more at a wavelength of 300 nm or more, thereby allowing the aforementioned photoinitiator in the adhesive layer to easily initiate photopolymerization.

When the base film has transmittance of less than 50% at a wavelength of 300 nm or more, light absorption of the photoinitiator of the adhesive layer may not be sufficient, and thus a sufficient reduction of the adhesive force may not be obtained during the step of detaching the adhesive sheet.

A thickness of the base film is not particularly limited, and the base film may be commonly formed at a thickness of 5 μm to 500 μm, preferably at a thickness of 10 μm to 300 μm, or 150 μm to 100 μm. In this case, supporting is possible during the high temperature process of the semiconductor, and it is possible to detach the adhesive sheet without damage during the step of peeling off.

The base film may be subjected to additional treatment to improve performances within the range that does not affect the desired effects of the present invention. For example, the surface of the base film may be subjected to a common physical or chemical treatment such as a matting treatment, a corona discharge treatment, a primer treatment, a cross-linking treatment, etc.

Adhesive Layer

The adhesive layer according to one embodiment of the present invention may be formed on one surface of the base film by using a particular material that satisfies the above-described adhesive force ratio (R). In the present invention, the adhesive layer may be formed using a material that exhibits an excellent adhesive force by heat and excellent reduction of the adhesive force by UV irradiation, particularly, in a combination of a binder resin having a photoreactive functional group, a specific photoinitiator, and an amine compound. Therefore, although light is transmitted from the base film at relatively low transmittance, excellent photoinitiation efficiency and an excellent reduction of the adhesive force after the high temperature process may be obtained.

In the present invention, the adhesive layer may include a binder resin having a photoreactive functional group, a photoinitiator having activity at a wavelength of 300 nm or more, and a tertiary amine compound. By using the above components in combination, a sufficient adhesive force may be obtained under high temperature conditions during a process of manufacturing a semiconductor device, and the adhesive force may be easily reduced by photocuring during the step of peeling off.

In the present invention, the adhesive layer may be formed using a composition for forming the adhesive layer including the above-described components.

In the present invention, the binder resin having a photoreactive functional group may include two kinds of different acrylic repeating units. Depending on the specific graft copolymer structure thereof, excellent adhesive stability may be obtained during the high temperature process.

In the present invention, a benzoylphenyl group of a first (meth)acrylate repeating unit may generate radicals by UV irradiation to initiate a curing reaction, and may allow stable reduction of the adhesive force even after the high-temperature process. The benzoylphenyl group may refer to a functional group represented by the following Chemical Formula 1.

[Chemical Formula 1]

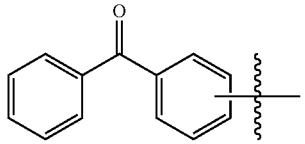

One or more of the benzoylphenyl group may be substituted to the first (meth)acryl acrylate repeating unit.

The first (meth)acrylate repeating unit may be derived from a monomer obtained by addition reaction of a compound having the benzoylphenyl group and the (meth)acrylate compound. Specifically, the first (meth)acrylate repeating unit may include benzoylphenylmethyl (meth)acrylate, benzoylphenyl ethyl (meth)acrylate, benzoylphenyl n-propyl (meth)acrylate, benzoylphenyl isopropyl (meth)acrylate, benzoylphenyl n-butyl (meth)acrylate, benzoylphenyl t-butyl (meth)acrylate, benzoylphenyl sec-butyl (meth)acrylate, benzoylphenyl pentyl (meth)acrylate, benzoylphenyl 2-ethylhexyl (meth)acrylate, benzoylphenyl 2-ethylbutyl (meth)acrylate, benzoylphenyl n-octyl (meth)acrylate, benzoylphenyl isooctyl (meth)acrylate, benzoylphenyl isononyl (meth)acrylate, etc., but is not limited thereto. These compounds may be used alone or in a mixture of two or more thereof.

In the present invention, a second (meth)acrylate repeating unit may achieve a crosslinked structure by a structure of a hydroxyl group, a carboxyl group, or a nitrogen-containing functional group, and as a result, cohesiveness of the adhesive may be improved by the three-dimensional crosslinked structure, thereby obtaining the sufficient adhesive force during the semiconductor process.

One or more of the hydroxyl group, the carboxyl group, and the nitrogen-containing functional group may be substituted to the second (meth)acrylate repeating unit.

The second (meth)acrylate repeating unit may be derived from a (meth)acrylate monomer containing a hydroxyl group, and the monomer may include 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl(meth)acrylate, 2-hydroxyethylene glycol (meth)acrylate, 2-hydroxypropylene glycol (meth)acrylate, etc. These compounds may be used alone or in a mixture of two or more thereof.

The second (meth)acrylate repeating unit may be derived from a (meth)acrylate monomer containing a carboxyl group, and the monomer may include (meth)acrylic acid, crotonic acid, maleic acid, fumaric acid, etc. These compounds may be used alone or in a mixture of two or more thereof.

The second (meth)acrylate repeating unit may be derived from a (meth)acrylate monomer containing a nitrogen-containing functional group, and the monomer may include (meth)acrylonitrile, N-vinyl pyrrolidone, N-vinyl capro-lactam, etc. These compounds may be used alone or in a mixture of two or more thereof.

20 to 95 mol % of the second (meth)acrylate repeating unit according to the present invention may include photopolymerizable (meth)acrylate side chains. The photopolymerizable (meth)acrylate side chain may be derived from a photopolymerizable compound which is able to bind with the hydroxyl group, the carboxyl group, or the nitrogen-containing functional group of the second (meth)acrylate repeating unit. Specifically, the photopolymerizable (meth)acrylate side chain may be derived from a reaction of the hydroxyl group, the carboxyl group, or the nitrogen-containing functional group of the second (meth)acrylate repeating unit and a compound having an isocyanate group or an epoxy group.

Specific examples of the photopolymerizable compound may include, as a compound capable of reacting with the hydroxyl group, (meth)acryloyloxy isocyanate, (meth)acryloyloxy methyl isocyanate, 2-(meth)acryloyloxy ethyl isocyanate, 3-(meth)acryloyloxy propyl isocyanate, 4-(meth)acryloyloxy butyl isocyanate, m-propenyl-α, α-dimethylbenzyl isocyanate, methacryloyl isocyanate, and allyl isocyanate; an acryloyl monoisocyanate compound obtained by reacting a diisocyanate compound or a polyisocyanate compound with 2-hydroxyethyl methacrylate; an acryloyl monoisocyanate compound obtained by reacting a diisocyanate compound or a polyisocyanate compound, a polyol compound, and 2-hydroxyethyl methacrylate, etc. Further, a compound capable of reacting with the carboxyl group may include one or two or more of glycidyl (meth)acrylate, allyl glycidyl ether, etc., but is not limited thereto.

When the photopolymerizable (meth)acrylate side chain is substituted with less than 20 mol % of the second (meth)acrylate repeating unit, it is possible that the reduction of peelability by UV irradiation may not be sufficient. When the photopolymerizable (meth)acrylate side chain is substituted with more than 95 mol % of the second (meth)acrylate repeating unit, it is possible that cohesiveness of the adhesive may be reduced before UV irradiation.

In the present invention, the binder resin having the photoreactive functional group may further include an additional (meth)acrylate repeating unit, in addition to the above-described first (meth)acrylate repeating unit and second (meth)acrylate repeating unit.

For example, the additional (meth)acrylate repeating unit may be a repeating unit that does not include the above-described specific functional group, for example, a repeating unit derived from an aliphatic (meth)acrylate, an alicyclic (meth)acrylate, and an aromatic (meth)acrylate.

The aliphatic (meth)acrylate may include an alkyl(meth)acrylate having an alkyl group having 1 to 20 carbon atoms, specifically, methyl (meth)acrylate, ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth)acrylate, etc.

The alicyclic (meth)acrylate may include a cycloalkyl (meth)acrylate having a cycloalkyl group having 3 to 30 carbon atoms, specifically, isobornyl acrylate (IBOA), trimethylcyclohexyl acrylate, cyclopentyl(meth)acrylate, cyclohexyl(meth)acrylate, dicyclopentanyl(meth)acrylate, dicyclopentenyloxy(meth)acrylate, etc.

The aromatic (meth)acrylate may include an alkyl(meth)acrylate having an aromatic group having 6 to 30 carbon atoms, specifically, phenylhydroxypropyl(meth)acrylate, o-phenylphenol EO (meth)acrylate, 2-hydroxy-3-phenylphenoxypropyl(meth)acrylate, phenol EO (meth)acrylate, etc.

In the present invention, the binder resin having the photoreactive functional group may have a weight average molecular weight of 100,000 g/mol to 3,000,000 g/mol, and preferably 400,000 g/mol to 2,000,000 g/mol. When the binder resin having the photoreactive functional group has a weight average molecular weight within the above range, an appropriate coating property and cohesiveness may be obtained, and preferably, no residues remain on an object to be attached during the step of peeling off.

In the present invention, the photoinitiator is a component that has activity at a wavelength of 300 nm or more, and initiates photopolymerization at the wavelength transmitted from the above-described base film, thereby facilitating reduction of the adhesive force of the adhesive layer. When the photoinitiator is used in combination with the amine compound described below, the adhesive force-reducing effect by photocuring may be remarkably improved. The photoinitiator may preferably be a component having activity at a wavelength of 300 nm to 420 nm or more.

The photoinitiator may include, for example, thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, 2,4-diisopropylthioxanthone, dodecylthioxanthone, bis(2,4,6-trimethylbenzoyl)-phenylphosphine oxide, 2-methyl-1[4-(methylthio)phenyl]-2-morpholinopropan-1-one, a mixture of oxy-phenyl-acetic acid 2-[2-oxo-2-phenyl-acetoxy-ethoxy]-ethylether and oxy-phenyl-acetic acid 2-[2-hydroxy-ethoxy]-ethylester, 2-benzyl-2-dimethylamino-1-(4-morpholinophenyl)-butan-1-one, 2,4,6-trimethylbenzoyl-diphenyl-phosphine oxide, etc. Preferably, isopropylthioxanthone or bis(2,4,6-trimethylbenzoyl)-phenylphosphine oxide may be used. These compounds may be used alone or in a mixture of two or more thereof. When the above compounds are used, activity by UV rays transmitted through the base film may be excellent, and sufficient reduction of the adhesive force may be achieved during photocuring by a synergistic effect with the tertiary amine compound described below.

In the present invention, the photoinitiator may be included in an amount of 0.1 parts by weight to 40 parts by weight, preferably 1 part by weight to 20 parts by weight, based on 100 parts by weight of the binder resin having the photoreactive functional group. When the photoinitiator is included in the above content range, an effective curing reaction may be induced, and deterioration of physical properties caused by components remaining after curing may be prevented.

In the present invention, when the tertiary amine compound is used in combination with the above-described photoinitiator, an increase of the curing reaction may be achieved through the synergistic effect even after the high temperature process. Specifically, the tertiary amine compound serves as a hydrogen donor to generate radicals, thereby exhibiting the synergistic effect with the photoinitiator.

The amine compound may include, for example, ethyl-p-dimethyl aminobenzoate, methyl-p-dimethyl aminobenzoate, 2-ethylhexyl-p-dimethyl aminobenzoate, octyl-p-dimethyl aminobenzoate, diethylaminoethyl methacrylate, dimethylaminoethyl methacrylate, N,N-dihydroxyethyl-p-toluidine, etc., preferably, ethyl-p-dimethyl aminobenzoate, or 2-ethylhexyl-p-dimethyl aminobenzoate. These compounds may be used alone or in a mixture of two or more thereof.

In the present invention, the amine compound may be included in an amount of 0.5 parts by weight to 40 parts by weight, preferably 1 part by weight to 20 parts by weight, based on 100 parts by weight of the binder resin having the photoreactive functional group. When the amine compound is included in the above content range, it is suitable for exhibiting a synergistic effect with the photoinitiator. When the amine compound is included at less than 0.5 parts by weight, it is not enough to provide sufficient reactivity of the photoinitiator. When the amine compound is included at more than 40 parts by weight, it remains after a UV curing reaction to influence the adhesive property.

In the present invention, the photoinitiator and the amine compound may be mixed at a weight ratio of 1:1 to 20, preferably at a weight ratio of 1:2 to 15. When the photoinitiator and the amine compound are mixed in the above range, the synergistic effect by the combination may be maximized.

In the present invention, the adhesive layer may further include a multifunctional crosslinking agent.

In the present invention, the multifunctional monomer is a component that imparts cohesiveness to the adhesive layer, and may include, for example, one or more compounds selected from the group consisting of isocyanate-based compounds, aziridine-based compounds, epoxy-based compounds, and metal chelate-based compounds. The isocyanate-based compounds, the aziridine-based compounds, the epoxy-based compounds, and the metal chelate-based compounds may be any compound without particular limitation, as long as it is commonly used in the art.

In the present invention, the crosslinking agent may be included in an amount of 0.1 parts by weight to 40 parts by weight, preferably 1 part by weight to 10 parts by weight, based on 100 parts by weight of the binder resin having the photoreactive functional group. When the crosslinking agent is included at less than 0.1 parts by weight, cohesiveness of the adhesive layer may be insufficient, and when the crosslinking agent is included at more than 40 parts by weight, the adhesive layer may not obtain the sufficient adhesive force before photocuring, and thus a detachment phenomenon may occur.

A method of forming the adhesive layer including the above components on the base film is not particularly limited. For example, a method of directly applying the composition for forming the adhesive layer of the present invention onto the base film to form the adhesive layer or a method of applying the composition for forming the adhesive layer onto a peelable base material to prepare the adhesive layer, and transferring the adhesive layer onto the base film using the peelable base material, may be used.

In this regard, a method of applying and drying the composition for forming the adhesive layer is not particularly limited, and for example, a method of applying the composition including the components, as it is or after being diluted with an appropriate organic solvent, by a known means such as comma coater, a gravure coater, a die coater, or a reverse coater, and then drying the solvent at a temperature of 60° C. to 200° C. for 10 seconds to 30 minutes. Further, in the above process, an aging process may be further performed in order to allow the sufficient crosslinking reaction of the adhesive.

A thickness of the adhesive layer is not particularly limited. Generally, the adhesive layer may be formed at a thickness of 5 μm to 100 μm. When the adhesive layer is formed in the above thickness range, supporting is possible during the high temperature process of the semiconductor, and it is possible to detach the adhesive sheet without damage during the step of peeling off.

In the present invention, a release film formed on the adhesive layer may be further included. Examples of the usable release film may include one or more plastic films such as a polyethylene terephthalate film, a polytetrafluoroethylene film, a polyethylene film, a polypropylene film, a polybutene film, a polybutadiene film, a vinylchloride copolymer film, or a polyimide film.

The surface of the release film may be release-treated with one or two or more of alkyd-based, silicone-based, fluorine-based, unsaturated ester-based, polyolefin-based, or wax-based release agents. Among these, alkyd-based, silicone-based, or fluorine-based release agents having heat resistance may be preferred.

The release film may be formed at a thickness of 10 µm to 500 µm, preferably 20 to 200 µm, but is not limited thereto.

The adhesive sheet for temporary fixation according to the present invention may be used as a protective film and a carrier film of the semiconductor process.

Further, the adhesive sheet for temporary fixation according to the present invention may include one or more adhesive layers, and accordingly, may be formed on one surface or both surfaces of the base film.

In addition, a method of preparing the adhesive sheet for temporary fixation may include, but is not particularly limited to, for example, a method of serially forming the adhesive layer and the release film (as needed) on the base film, or a method of separately preparing the release film on which the adhesive layer is formed, and then laminating the release film on the base film.

The lamination method may include, but is not particularly limited to, a hot roll lamination method or a stack pressing method. In view of dual continuous processing and efficiency, the hot roll lamination method is preferred. The hot roll lamination may be performed at a temperature of 10° C. to 100° C. and a pressure of 0.1 Kgf/cm$^2$ to 10 Kgf/cm$^2$, but is not limited thereto.

FIGS. 1 and 2 show cross-sectional views of an adhesive sheet for temporary fixation 10 according to one embodiment of the present invention.

Referring to (a) of FIG. 1, the adhesive sheet for temporary fixation 10 according to one embodiment of the present invention may have a structure in which a base film 100 and an adhesive layer 200 are laminated.

When the adhesive sheet 10 is applied to a process of manufacturing a semiconductor device, a surface 200(a) of the adhesive layer 200 on which the base film 100 is not formed may be attached to a predetermined portion of the semiconductor device.

Referring to (b) of FIG. 1, the adhesive sheet for temporary fixation 10 according to one embodiment of the present invention may have a structure in which the base film 100, the adhesive layer 200, and a release film 300 are serially laminated.

When the adhesive sheet 10 is applied to a process of manufacturing a semiconductor device, the release film 300 is peeled off from the adhesive layer 200, and then one surface of the adhesive layer 200 from which the release film 300 is peeled off may be attached to a predetermined portion of the semiconductor device.

Referring to (a) of FIG. 2, the adhesive sheet for temporary fixation 10 according to one embodiment of the present invention may have a structure in which two adhesive layers 210 and 220 are formed on respective surfaces of the base film 100.

In this case, the structure may be one in which the first adhesive layer 210, the base film 100, and the second adhesive layer 220 are serially laminated.

When the adhesive sheet 10 is applied to a process of manufacturing a semiconductor device, the surface of either one of the adhesive layers on which the base film 100 is not formed may be attached to a predetermined portion of the semiconductor device. For example, a surface 220(a) of the second adhesive layer 220 on which the base film 100 is not formed may be attached to a predetermined portion of the semiconductor device.

Referring to (b) of FIG. 2, the adhesive sheet for temporary fixation 10 according to one embodiment of the present invention may have a structure in which a first release film 310, the first adhesive layer 210, the base film 100, the second adhesive layer 220, and a second release film 320 are serially laminated.

When the adhesive sheet 10 is applied to a process of manufacturing a semiconductor device, the release films 310 and 320 are peeled off from the adhesive layers 210 and 220, and then one surface of each of the adhesive layers 210 and 220 from which the release films 310 and 320 are peeled off may be attached to a predetermined portion of the semiconductor device.

Thereafter, in the step of peeling off the adhesive sheet 10, UV rays are irradiated onto the first adhesive layer 210 to transmit through the lower base film 100, thereby photocuring the second adhesive layer 220. Accordingly, the adhesive force of the adhesive layer 200 may be reduced, and thus the adhesive sheet for temporary fixation 10 may be easily released from the semiconductor device.

II. Method of Manufacturing Semiconductor Device

According to another embodiment of the present invention, a method of manufacturing a semiconductor device using the above-described adhesive sheet for temporary fixation is provided.

Commonly, the method of manufacturing the semiconductor device may include a process which is performed under high temperature conditions, and in this case, there is a problem in that the base film or the adhesive layer may be thermally decomposed or additives included in the adhesive layer may be separated. In this regard, it is difficult to achieve a sufficient adhesive force during the process of manufacturing the semiconductor device or to achieve a sufficient reduction of the adhesive force by photocuring the adhesive sheet during the step of peeling off.

In the adhesive sheet for temporary fixation according to the present invention, all the problems are improved by forming the base film using the UV-transmittable heat-resistant polymer, and forming the adhesive layer using a specific component that is able to initiate photopolymerization at a transmission wavelength of the base film and to improve reactivity. Accordingly, it was confirmed that the manufacturing efficiency of the semiconductor is improved and the manufactured semiconductor has excellent quality.

The method of manufacturing the semiconductor device according to another embodiment of the present invention may include: attaching the adhesive layer of the adhesive sheet for temporary fixation onto a predetermined portion of the semiconductor device; performing a predetermined process of the semiconductor device on which the adhesive sheet is attached; irradiating UV rays onto the base film of the adhesive sheet for temporary fixation after performing the predetermined process; and detaching the adhesive sheet for temporary fixation from the semiconductor device.

In the present invention, the above description of the adhesive sheet for temporary fixation is also applied to the method of manufacturing the semiconductor device, and a commonly known method, excluding detailed process conditions described below, may be applied thereto without particular limitation.

In the method of manufacturing the semiconductor device according to another embodiment of the present invention, the predetermined process of the semiconductor device may be performed at a temperature of 60° C. to 300° C. Although the semiconductor device undergoes this high temperature process, sufficient adhesive force may be achieved during the process of manufacturing the semiconductor device and a sufficient reduction of the adhesive force may also be achieved by photocuring of the adhesive sheet during the step of peeling off.

In the method of manufacturing the semiconductor device according to another embodiment of the present invention, the step of UV irradiating is a step of initiating the photocuring of the adhesive layer, leading to easy release of the adhesive sheet from the semiconductor device due to the reduced adhesive force of the adhesive layer.

In the method of manufacturing the semiconductor device according to another embodiment of the present invention, when the adhesive sheet for temporary fixation further includes a release film, the method may further include the step of peeling off the release film from the adhesive layer before attaching the adhesive layer of the adhesive sheet onto the predetermined portion of the semiconductor device.

According to the above-described method, the manufacturing efficiency of the semiconductor device may be improved and the manufactured semiconductor device may have excellent quality.

Effect of the Invention

An adhesive sheet for temporary fixation according to the present invention may have an appropriate adhesive force during a process of manufacturing a semiconductor device, and the adhesive force may be easily reduced by photocuring to allow easy release after completing the process.

Further, the adhesive sheet for temporary fixation according to the present invention may have excellent heat resistance, and therefore, although the adhesive sheet is applied to the process of manufacturing the semiconductor device to undergo a high temperature process, it may exhibit a sufficient reduction of the adhesive force by photocuring during the step of peeling off the adhesive sheet.

BRIEF DESCRIPTION OF DRAWINGS

FIGS. 1 and 2 are schematic illustrations of a cross-sectional structure of an adhesive sheet for temporary fixation 10 according to an embodiment of the present invention.

DETAILED DESCRIPTION OF THE EMBODIMENTS

Hereinafter, preferred examples will be provided for better understanding of the present invention. However, the following examples are for illustrative purposes only, and the invention is not intended to be limited by these examples.

Preparation Example: Preparation of Composition for Forming Adhesive Layer

Preparation Example 1

A monomer mixture consisting of 75 g of 2-ethylhexyl acrylate (2-EHA), 5 g of 4-benzoylphenyl methacrylate, and 20 g of hydroxyethyl acrylate (HEA) was introduced into a reactor equipped with a cooling system for reflux under nitrogen gas and easy control of the temperature. Subsequently, 400 pm of n-DDM as a chain transfer agent (CTA) and 100 g of ethyl acetate (EAc) as a solvent based on 100 g of the monomer mixture were added thereto, and sufficiently mixed at 30° C. for 30 minutes or more while injecting nitrogen to remove oxygen in the reactor. Then, the temperature was increased and maintained at 62° C., 300 ppm of V-60 (azobisisobutyronitrile) as a reaction initiator was introduced to initiate the reaction, and then polymerization was allowed for 6 hours to prepare a primary reaction product.

The primary reaction product was blended with 24 g (90 mol % with respect to HEA in the primary reaction product) of 2-methacryloyl oxyethyl isocyanate (MOI) and 0.24 g of a catalyst (DBTDL: dibutyl tin dilaurate), and reacted at 40° C. for 24 hours to introduce a UV curable group to the polymer side chain in the primary reaction product, thereby preparing a (meth)acrylate binder resin (a-1).

100 g of the (meth)acrylate binder resin (a-1) was mixed with 4 g of a TDI-based isocyanate curing agent, 3 g of isopropylthioxanthone as a photoinitiator, and 7 g of ethyl-p-dimethyl amino benzoate as an amine compound to prepare a composition for forming an adhesive layer (A-1).

Preparation Example 2

A monomer mixture consisting of 20 g of ethyl acrylate, 63 g of 2-ethylhexyl acrylate (2-EHA), 2 g of 4-benzoylphenyl acrylate, and 15 g of hydroxyethyl acrylate (HEA) was introduced into a reactor equipped with a cooling system for reflux under nitrogen gas and easy control of the temperature. Subsequently, 400 pm of n-DDM (n-dodecyl mercaptan) as a chain transfer agent (CTA) and 100 g of ethyl acetate (EAc) as a solvent based on 100 g of the monomer mixture were added thereto, and sufficiently mixed at 30° C. for 30 minutes or more while injecting nitrogen to remove oxygen in the reactor. Then, the temperature was increased and maintained at 62° C., 300 ppm of V-60 (azobisisobutyronitrile) as a reaction initiator was introduced to initiate the reaction, and then polymerization was allowed for 6 hours to prepare a primary reaction product.

The primary reaction product was blended with 15 g (76 mol % with respect to HEA in the primary reaction product) of 2-methacryloyl oxyethyl isocyanate (MOI) and 0.15 g of a catalyst (DBTDL: dibutyl tin dilaurate), and reacted at 40° C. for 24 hours to introduce a UV curable group to the polymer side chain in the primary reaction product, thereby preparing a (meth)acrylate binder resin (a-2).

100 g of the (meth)acrylate binder resin (a-2) was mixed with 8 g of a TDI-based isocyanate curing agent, 3 g of isopropylthioxanthone as a photoinitiator, and 10 g of ethyl-p-dimethyl amino benzoate as an amine compound to prepare a composition for forming an adhesive layer (A-2).

Preparation Example 3

100 g of the (meth)acrylate binder resin (a-1) of Preparation Example 1 was mixed with 4 g of a TDI-based isocyanate curing agent, 3 g of bis(2,4,6-trimethylbenzoyl)-phenylphosphine oxide as a photoinitiator, and 7 g of ethyl-p-dimethyl amino benzoate as an amine compound to prepare a composition for forming an adhesive layer (A-3).

Preparation Example 4

100 g of the (meth)acrylate binder resin (a-1) of Preparation Example 1 was mixed with 2 g of a TDI-based isocyanate curing agent, 2 g of isopropylthioxanthone as a photoinitiator, and 5 g of 2-ethylhexyl-p-dimethyl amino benzoate as an amine compound to prepare a composition for forming an adhesive layer (A-4).

Comparative Preparation Example 1

A monomer mixture consisting of 80 g of 2-ethylhexyl acrylate (2-EHA) and 20 g of hydroxyethyl acrylate (HEA) was introduced into a reactor equipped with a cooling system for reflux under nitrogen gas and easy control of the temperature. Subsequently, 400 pm of n-DDM as a chain transfer agent (CTA) and 100 g of ethyl acetate (EAc) as a solvent based on 100 g of the monomer mixture were added thereto, and sufficiently mixed at 30° C. for 30 minutes or more while injecting nitrogen to remove oxygen in the reactor. Then, the temperature was increased and maintained at 62° C., 300 ppm of V-60 (azobisisobutyronitrile) as a reaction initiator was introduced to initiate the reaction, and then polymerization was allowed for 6 hours to prepare a primary reaction product.

The primary reaction product was blended with 24 g (90 mol % with respect to HEA in the primary reaction product) of 2-methacryloyl oxyethyl isocyanate (MOI) and 0.24 g of a catalyst (DBTDL: dibutyl tin dilaurate), and reacted at 40° C. for 24 hours to introduce a UV curable group to the polymer side chain in the primary reaction product, thereby preparing a (meth)acrylate binder resin (b-1).

100 g of the (meth)acrylate binder resin (b-1) was mixed with 4 g of a TDI-based isocyanate curing agent, 3 g of isopropylthioxanthone as a photoinitiator, and 7 g of ethyl-p-dimethyl amino benzoate as an amine compound to prepare a composition for forming an adhesive layer (B-1).

Comparative Preparation Example 2

100 g of the (meth)acrylate binder resin (a-1) of Preparation Example 1 was mixed with 4 g of a TDI-based isocyanate curing agent to prepare a composition for forming an adhesive layer (B-2).

Comparative Preparation Example 3

100 g of the (meth)acrylate binder resin (a-1) of Preparation Example 1 was mixed with 2 g of a TDI-based isocyanate curing agent and 2 g of isopropylthioxanthone as a photoinitiator to prepare a composition for forming an adhesive layer (B-3).

Examples and Comparative Examples

Example 1

The composition for forming an adhesive layer (A-1) of Preparation Example 1 was applied onto a polyethylene terephthalate film (thickness of 38 μm) which had been release-treated, and dried at 110° C. for 3 minutes to form an adhesive layer having a thickness of about 30 μm. The formed adhesive layer was laminated on a polyethylene naphthalate base film having a thickness of 100 μm, and then aged to obtain an adhesive sheet for temporary fixation.

Examples 2 to 4 and Comparative Examples 1 to 4

Each adhesive sheet for temporary fixation was prepared in the same manner as in Example 1, except that components and amounts of the following Table 1 were applied.

TABLE 1

| | Base film | Adhesive layer |
|---|---|---|
| Example 1 | Polyethylene naphthalate, Tg: 153° C. | Preparation Example 1 (A-1) |
| Example 2 | Polyamideimide, Tg: 308° C. | Preparation Example 2 (A-2) |
| Example 3 | Polyethylene naphthalate, Tg: 153° C. | Preparation Example 3 (A-3) |
| Example 4 | Polyethylene terephthalate, Tg: 92° C. | Preparation Example 4 (A-4) |
| Comparative Example 1 | Polyethylene naphthalate, Tg: 153° C. | Comparative Preparation Example 1 (B-1) |
| Comparative Example 2 | Polyethylene naphthalate, Tg: 153° C. | Comparative Preparation Example 2 (B-2) |
| Comparative Example 3 | Polyamideimide, Tg: 308° C. | Comparative Preparation Example 3 (B-3) |
| Comparative Example 4 | Polypropylene, Tg: 10° C. | Preparation Example 1 (A-1) |

Experimental Example: Evaluations of Adhesive Force and Peelability

The adhesive sheets for temporary fixation prepared according to the examples and comparative examples were evaluated for adhesive force and peelability according to photocuring by the following methods, and the results are shown in Table 2 below.

Each of the adhesive sheets for temporary fixation prepared according to the examples and comparative examples was cut to have a width of 25 mm, and then attached to a silicon wafer using a 2 kg roller to prepare a sample A (before heat treatment).

Next, the adhesive sheet for temporary fixation attached to the silicon wafer was left in an oven at 180° C. for 2 hours to prepare a heat-treated sample B (after heat treatment).

The base films of the non-heat-treated sample A and the heat-treated sample B were or not irradiated with UV (using a mercury lamp having a mixed wavelength of 200 nm to 500 nm) at a light dose of 1000 mJ/cm$^2$ to prepare respective samples, which were then evaluated for adhesive force.

The adhesive force (gf/25 mm) was measured using a Texture Analyzer of Stable Micro Systems at a speed of 300 mm/min and an angle of 180 degrees, and the results are shown in Table 2 below.

Further, the measured adhesive force was used to calculate an adhesive force ratio (R) by the following general formula, and the results are also shown in Table 2 below.

$$R(\%) = A2'*100/A1' \quad \text{[General Formula 1]}$$

In General Formula 1, A1' represents the adhesive force of the adhesive layer which was measured after heat treatment at 180° C. for 2 hours, and A2' represents the adhesive force of the adhesive layer measured after UV irradiation following the heat treatment.

TABLE 2

| | | Evaluation of adhesive force (gf/25 mm) of sample B after heat treatment | |
|---|---|---|---|
| | R (%) | Before light irradiation | After light irradiation |
| Example 1 | 2.55 | 785 | 20 |
| Example 2 | 11.29 | 620 | 70 |
| Example 3 | 12.32 | 812 | 100 |
| Example 4 | 5.14 | 720 | 37 |
| Comparative Example 1 | 97.89 | 380 | 372 |
| Comparative Example 2 | 99.57 | 703 | 700 |
| Comparative Example 3 | 64.58 | 542 | 350 |
| Comparative Example 4 | Not measurable | Not measurable | Not measurable |

As confirmed in the data of the sample B after heat treatment in Table 2, the adhesive sheets for temporary fixation prepared according to the present invention showed an adhesive force ratio of less than 50% even after the high heat temperature process, indicating that the adhesive force was greatly reduced and the adhesive sheet was removable without adhesive residues. In contrast, Comparative Example 1 to Comparative Example 3 showed an adhesive force ratio of more than 50% after the high heat temperature process, and thus generated adhesive residues due to the high adhesive force. Comparative Example 4 showed a severe change in appearance such as wrinkles and delamination after the heat treatment due to lack of heat resistance of the base film, and thus its adhesive strength was not measurable.

REFERENCE NUMERALS

10: Adhesive sheet for temporary fixation
100: Base film
200: Adhesive layer
200(a): surface of the adhesive layer 200
210: first adhesive layer
220: second adhesive layer
220(a): surface of the second adhesive layer 220
300: Release film
310: first release film
320: second release film

The invention claimed is:

1. An adhesive sheet for temporary fixation, the adhesive sheet comprising: a polymer base film having a glass transition temperature (Tg) of at least 60° C.; and at least one adhesive layer including a binder resin having at least one photoreactive functional group; a photoinitiator having activity at a wavelength of 300 nm or more; and a tertiary amine compound, wherein a ratio (R) of an adhesive force (A2') to an initial adhesive force (A1') is 50% or less as defined by General Formula 1:

$$R(\%) = A2'*100/A1' \quad \text{[General Formula 1]}$$

wherein, in the General Formula 1, A1' represents the adhesive force of the adhesive layer after heat treatment at 180° C. for 2 hours, and A2' represents the adhesive force of the adhesive layer measured after light-irradiating the heat-treated adhesive layer with UV at a multi-wavelength of 200 nm to 500 nm at a light dose of 100 mJ/cm$^2$ to 1000 mJ/cm$^2$.

2. The adhesive sheet for temporary fixation of claim 1, wherein the polymer base film has transmittance of 50% or more at a wavelength of 300 nm or more.

3. The adhesive sheet for temporary fixation of claim 1, wherein the polymer base film includes one or more polymer compounds selected from the group consisting of polyimide, polyamideimide, polyetherether ketone, polyethylene terephthalate, polyethylene naphthalate, polyphenylene sulfide, and polyamide.

4. The adhesive sheet for temporary fixation of claim 1, wherein the binder resin includes a first (meth)acrylate repeating unit including a benzoylphenyl group; and a second (meth)acrylate repeating unit including one or more functional groups selected from the group consisting of a hydroxyl group, a carboxyl group, and a nitrogen-containing functional group, and 20 to 95 mol % of the second (meth)acrylate repeating unit including a photopolymerizable (meth)acrylate-based side chain.

5. The adhesive sheet for temporary fixation of claim 1, wherein the photoinitiator includes one or more selected from the group consisting of thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, 2,4-diisopropylthioxanthone, dodecylthioxanthone, bis(2,4,6-trimethylbenzoyl)-phenylphosphine oxide, 2-methyl-1[4-(methylthio)phenyl]-2-morpholinopropan-1-one, a mixture of oxy-phenyl-acetic acid 2-[2-oxo-2-phenyl-acetoxy-ethoxy]-ethylether and oxy-phenyl-acetic acid 2-[2-hydroxy-ethoxy]-ethylester, 2-benzyl-2-dimethylamino-1-(4-morpholinophenyl)-butan-1-one, and 2,4,6-trimethylbenzoyl-diphenyl-phosphine oxide.

6. The adhesive sheet for temporary fixation of claim 1, wherein the tertiary amine compound includes one or more selected from the group consisting of ethyl-p-dimethyl aminobenzoate, methyl-p-dimethyl aminobenzoate, 2-ethylhexyl-p-dimethyl aminobenzoate, octyl-p-dimethyl aminobenzoate, diethylaminoethyl methacrylate, dimethylaminoethyl methacrylate, and N,N-dihydroxyethyl-p-toluidine.

7. The adhesive sheet for temporary fixation of claim 1, wherein a weight ratio of the photoinitiator and the tertiary amine compound is 1:1 to 20.

8. The adhesive sheet for temporary fixation of claim 1, wherein the adhesive sheet provides a function of a protective film or a carrier film of a semiconductor process.

9. The adhesive sheet for temporary fixation of claim 1, further comprising a release film on the adhesive layer.

10. The adhesive sheet for temporary fixation of claim 9, further comprising an additional release film, wherein the adhesive layer is composed of two layers, and the base film is positioned between the two layers and each release film is on each of the two layers opposite side to the base film.

11. A method of manufacturing a semiconductor device, the method comprising the steps of: attaching the adhesive layer of the adhesive sheet for temporary fixation of claim 1 onto a predetermined portion of the semiconductor device; performing a predetermined process of the semiconductor device on which the adhesive sheet is attached; irradiating UV rays onto the base film of the adhesive sheet for temporary fixation after performing the predetermined process; and detaching the adhesive sheet for temporary fixation from the semiconductor device.

12. The method of claim 11, wherein the predetermined process of the semiconductor device is performed at a temperature of 60° C. to 300° C.

* * * * *